(12) United States Patent
Bour et al.

(10) Patent No.: US 7,440,666 B2
(45) Date of Patent: Oct. 21, 2008

(54) BURIED HETEROSTUCTURE DEVICE HAVING INTEGRATED WAVEGUIDE GRATING FABRICATED BY SINGLE STEP MOCVD

(75) Inventors: David P. Bour, Cupertino, CA (US); Scott W. Corzine, Sunnyvale, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 154 days.

(21) Appl. No.: 11/154,034

(22) Filed: Jun. 16, 2005

(65) Prior Publication Data

US 2005/0276557 A1 Dec. 15, 2005

Related U.S. Application Data

(63) Continuation-in-part of application No. 10/787,349, filed on Feb. 25, 2004, now Pat. No. 7,184,640.

(51) Int. Cl.
*G02B 6/10* (2006.01)
*H01S 5/12* (2006.01)

(52) U.S. Cl. .................................... 385/129; 372/43.01

(58) Field of Classification Search ........................ None
See application file for complete search history.

(56) References Cited

U.S. PATENT DOCUMENTS

| 5,185,289 | A | 2/1993 | Meier |
| 5,323,027 | A | 6/1994 | Yamada et al. |
| 5,659,565 | A | 8/1997 | Kitamura |
| 5,780,876 | A | 7/1998 | Hata |
| 6,300,153 | B1 | 10/2001 | Koui |
| 6,396,861 | B1 * | 5/2002 | Shimizu et al. ......... 372/45.01 |
| 6,445,723 | B1 | 9/2002 | Mehrdad |
| 6,498,076 | B1 | 12/2002 | Koui |
| 6,589,806 | B2 | 7/2003 | Sasaki |
| 2001/0010701 | A1 | 8/2001 | Furushima |

FOREIGN PATENT DOCUMENTS

JP 10-22567 A * 1/1998

OTHER PUBLICATIONS

Bertone, D. et al., "Etching in InP-based MQW Laser Structure in a MOCVD Reactor by Chlorinated Compounds", *Journal of Crystal Growth, 195.*, (1998),624-629.

(Continued)

*Primary Examiner*—Sung Pak
*Assistant Examiner*—Mike Stahl

(57) ABSTRACT

The device is an optoelectronic device or transparent waveguide device that comprises a growth surface, a growth mask, an optical waveguide core mesa and a cladding layer. The growth mask is located on the semiconductor surface and defines an elongate growth window having a periodic grating profile. The optical waveguide core mesa is located in the growth window and has a trapezoidal cross-sectional shape. The cladding layer covers the optical waveguide core mesa and extends over at least part of the growth mask. Such devices are fabricated by providing a wafer comprising a growth surface, growing an optical waveguide core mesa on the growth surface by micro-selective area growth at a first growth temperature and covering the optical waveguide core mesa with cladding material at a second growth temperature, lower than the first growth temperature.

14 Claims, 9 Drawing Sheets

OTHER PUBLICATIONS

Kudo, Koji et al., "Densely Arrayed Eight-Wavelength Semiconductor Lasers Fabricated by Microarray Selective Epitaxy", *IEEE Journal of Selected Topics in Quantum Electronics, vol. 5, No. 3.*, (May/Jun. 1999).428-434.

Tsuchiya, T. et al., "Selective-Area Growth of High-Crystalline-Quality InGaAIAs by Metal-Organic Vapor-Phase Epitaxy", *Journal of Crystal Growth, 248.*, (2003),384-389.

Sudo, Shinya et al., "Growth Pressure Dependence of Neighboring Mask Interference in Densely Arrayed Narrow-Stripe Selective MOVPE for Integrated Photonic Devices", *Journal of Crystal Growth, 221.*, (2000),189-195.

* cited by examiner

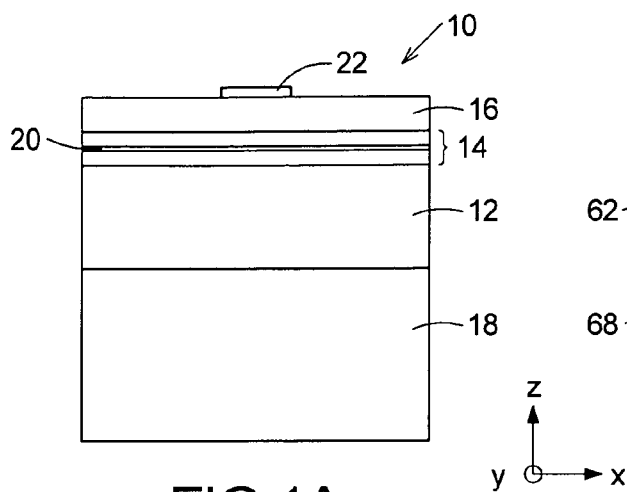
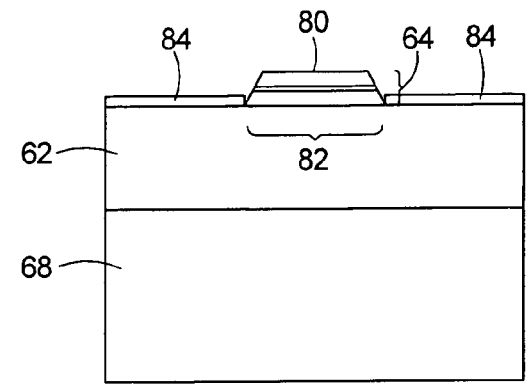
FIG.1A (PRIOR ART)
FIG.2A (PRIOR ART)
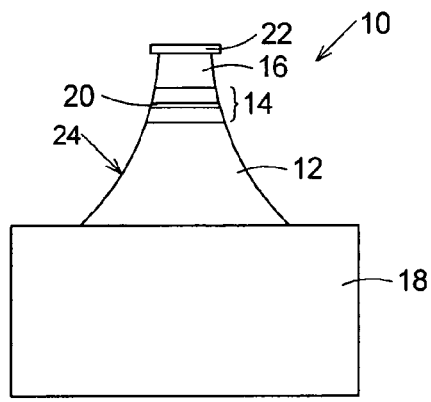
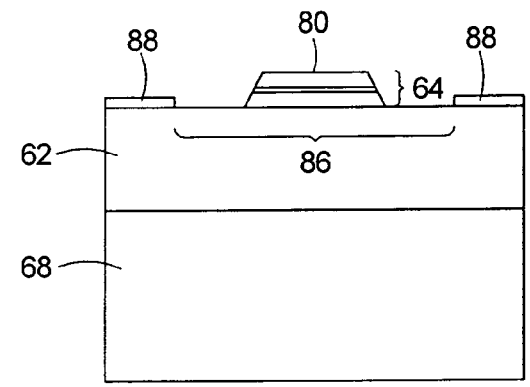
FIG.1B (PRIOR ART)
FIG.2B (PRIOR ART)
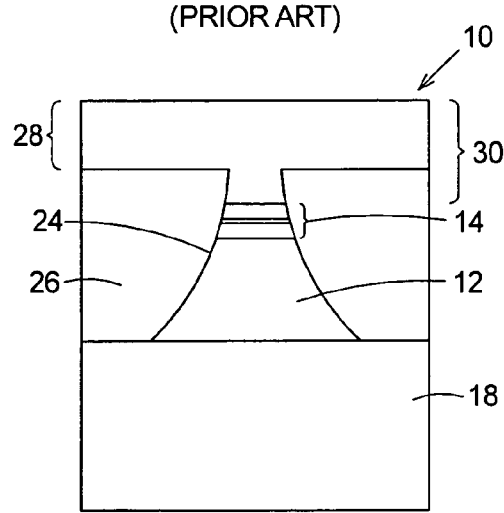
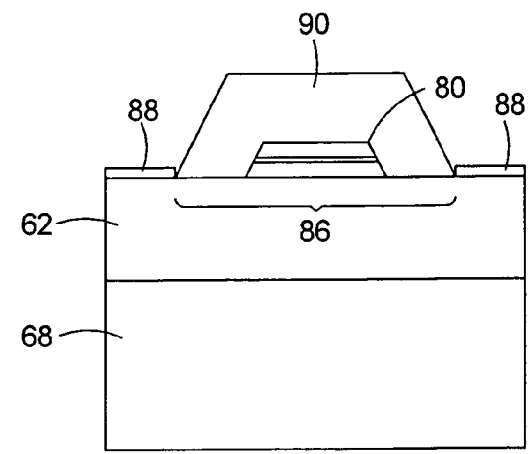
FIG.1C (PRIOR ART)
FIG.2C (PRIOR ART)

BURIED HETEROSTUCTURE DEVICE HAVING INTEGRATED WAVEGUIDE GRATING FABRICATED BY SINGLE STEP MOCVD

CROSS REFERENCE TO RELATED APPLICATION

This application is a continuation-in-part of application Ser. No. 10/787,349, entitled "Buried Heterostructure Device Fabricated by single Step MOCVD, filed on Feb. 25, 2004, now U.S. Pat. No. 7,184,640 and hereby incorporated by reference.

BACKGROUND

Optoelectronic devices are used in many applications including telecommunications, data storage and signalling. Certain types of optoelectronic devices such as laser diodes, optoelectronic modulators, semiconductor optical amplifiers, semiconductor gain media, etc., have an active region located in an optical waveguide. The optical waveguide typically incorporates different structures to guide the light laterally, i.e., parallel to the major surface of the substrate on which the device is fabricated, and transversely, i.e., orthogonal to the major surface of the substrate. In the transverse direction, the light is guided by a refractive index contrast between the semiconductor material of the active region and cladding layers between which the active layer is sandwiched. In the lateral direction, the light is guided by a ridge waveguide structure or a buried heterostructure waveguide defined at least in part in the layer structure of which the cladding layers and the active region form part.

In telecommunications applications, the most commonly used lateral waveguide structure is the buried heterostructure. A buried heterostructure provides advantages over a ridge waveguide structure because of the large refractive index contrast it provides at the active region. This allows the optical waveguide to be made very narrow, while preserving a high spatial overlap between the fundamental optical mode and the active region. This provides such advantages as a low threshold current in lasers, a lower operating current in semiconductor optical amplifiers and optical gain media, and a low capacitance, and, hence, increased modulation speed, in optoelectronic modulators and directly modulated lasers.

A typical process for fabricating optoelectronic devices incorporating a buried heterostructure lateral waveguide is illustrated in FIGS. 1A-1C. First, a layer structure 10 from which hundreds or thousands of optoelectronic devices are made is grown. FIGS. 1A-1C are side views of a portion of layer structure 10 in which a single optoelectronic device is fabricated. FIG. 1A shows an n-type cladding layer 12, an undoped active region 14 and a p-type cladding layer 16 grown on a substrate 18. The layers are grown by metal organic chemical vapor deposition (MOCVD), also known in the art as organo-metallic vapor phase epitaxy (OMVPE).

The materials of layer structure 10 are Group III-V semiconductors typically composed of such elements as indium, gallium, arsenic and phosphorus. The semiconductor material of cladding layers 12 and 16 has a lower refractive index than that of active region 14. The thickness of n-type cladding layer 12 is about 2 μm, whereas the thickness of p-type cladding layer 16 in layer structure 10 is only about 200 nm-400 nm.

A quantum well structure 20 composed of one or more quantum wells is located in active region 14. Each quantum well is defined by a quantum well layer of low band-gap semiconductor material sandwiched between barrier layers of higher band-gap semiconductor material.

FIG. 1A also shows a mask 22 deposited on the surface of p-type cladding layer 16. The material of the mask is typically silicon dioxide. Mask 22 is elongate in the y-direction shown in FIG. 1A, and is typically about 1-8 μm wide.

Layer structure 10 is then removed from the growth chamber and is subject to two etching processes that define a mesa 24 in the layer structure, as shown in FIG. 1B. A reactive ion etch (RIE) is initially used to remove portions of p-type cladding layer 16, active region 14 and n-type cladding layer 12 not protected by mask 22. The RIE damages the edges of the layers subject to etching. Such damaged edges significantly impair the efficiency of the finished optoelectronic device. Accordingly, layer structure 10 is additionally subject to a wet etch that removes the damaged edges of p-type cladding layer 16, active region 14 and n-type cladding layer 12. The wet etch process additionally defines the overhang of mask 22 relative to mesa 24. FIG. 1B shows layer structure 10 after both etching processes have been performed.

Layer structure 10 is then returned to the growth chamber, and an overgrowth 26 of a high resistivity group III-V semiconductor material having a lower refractive index than the materials of active region 14 is epitaxially grown on the layer structure by MOCVD, as shown in FIG. 1C. The overgrowth grows on the exposed surface of substrate 18 and on the sidewalls of mesa 24, but does not grow on mask 22. Accordingly, overgrowth 26 fills the cavities etched into the layer structure between adjacent mesas. Deposition of the overgrowth continues until its growth surface reaches the top surface of p-type cladding layer 16.

In an embodiment of layer structure 10 in which the material of cladding layers 12 and 16 is indium phosphide (InP), a typical material of overgrowth 26 is indium phosphide doped with iron (InP:Fe). The refractive index of the overgrowth material is about 0.2 less than that of the materials of active region 14. The overgrowth material is doped with iron (Fe) to reduce its conductivity.

Layer structure 10 is then removed from the growth chamber and is subject to another wet etch process that removes the mask 22 from the surface of p-type cladding layer 16.

Layer structure 10 is then returned to the growth chamber, where additional p-type cladding layer material 28 is grown over the exposed surfaces of p-type cladding layer 16 and overgrowth 26, as shown in FIG. 1C. P-type cladding layer 16 and the portion of the additional p-type cladding layer material grown on p-type cladding layer 16 collectively constitute p-type cladding layer 30. P-type cladding layer typically has a thickness about the same as that of n-type cladding layer 12, i.e., about 2 μm.

A p-contact layer (not shown) is grown on top of p-type cladding layer 30, and electrode layers (not shown) are deposited on the bottom surface of substrate 18 and the exposed surface of the p-contact layer. The electrode layers are then patterned to define electrodes. Layer structure 10 is then singulated into individual optoelectronic devices.

Although the above-described buried heterostructure waveguide provides performance advantages, the above-described fabrication process is complex and is difficult to control. In particular, it is essential to etch the layer structure using a low-damage etch process, since the etch proceeds through the p-i-n junction formed by layers of p-type, undoped and n-type material (not shown) in active region 14. It is highly undesirable to have carrier states associated with structural defects in the etched sidewalls of the mesa. Moreover, the width of active region 14, i.e., the dimension of the active region in the x-direction shown in FIG. 1A, is defined by the etch process. The width of the active region has to be accurately defined: too narrow an active region results in insufficient gain or too high a threshold current. Too wide an active region allows the optoelectronic device to operate in multiple optical modes, which is undesirable in many applications. Finally, the undercut profile of mesa 24 relative to mask 22 must also be accurately controlled to ensure that overgrowth 26 provides a reasonably planar surface on which to grow the additional p-type cladding layer material 28.

Optoelectronic devices for use in long wavelength telecommunications applications originally had indium gallium arsenide phosphide (InGaAsP) as the material of the quantum well layers. Using aluminum indium gallium arsenide (AlInGaAs) instead of InGaAsP as the material of the quantum well layers improves the high temperature characteristics of the optoelectronic device. However, using AlInGaAs as the material of the quantum well layers makes fabrication of the buried heterostructure waveguide structure considerably more difficult. This is because the presence of aluminum in the material of the quantum well layers leads to the formation of a stable layer of oxide on the sidewall of the mesa 24 during the wet etch. Unlike the less-stable oxides of indium and gallium formed when InGaAsP is etched, aluminum oxide cannot be thermally desorbed in the MOCVD growth chamber prior to growing overgrowth 26. Instead, the aluminum oxide layer persists on the sidewalls of the mesa, and degrades the quality of the interface between the mesa and overgrowth 26.

The problem of damage to the exposed sidewalls of the mesa 24 is exacerbated by the need to transfer the wafer from the etch station to the growth chamber after the etch process has been performed. The exposes the sidewalls of the mesa to ambient air, which typically contains water vapor and oxygen. The water vapor and oxygen can cause additional oxide formation on the sidewalls of the mesa.

Various approaches have been proposed to deal with the problem of stable aluminum oxides forming on the sidewalls of the mesa. For example, in-situ etching may be used, as described by Bertone et al. in *Etching of InP-based MQW Structure in a MOCVD Reactor by Chlorinated Compounds*, 195 J. CRYST. GROWTH, 624 (1998). However, such approaches are expensive and difficult to implement, and may be incompatible with fabrication processes for other devices.

In *Densely Arrayed Eight-Wavelength Semiconductor Lasers Fabricated by Microarray Selective Epitaxy*, 5 IEEE J. SEL. TOP. QUANTUM ELECTRON., 428 (1999), K. Kudo et al. disclose a process for fabricating an array of buried heterostructure lasers using micro-selective area growth. This process is illustrated in FIGS. 2A-2C. FIG. 2A shows a substrate 68 on which an n-type cladding layer 62 has been grown. An optical waveguide core mesa 80 that additionally constitutes the active region 64 of the optoelectronic device is then grown by micro-selective area growth on the surface of n-type cladding layer 62. The optical waveguide core mesa is grown in an elongate window 82 defined by two elongate mask patterns 84. The optical waveguide core mesa has a trapezoidal cross-sectional shape, and is elongate in the y-direction shown.

Using micro-selective area growth to fabricate an optical waveguide core mesa that includes the active region of a buried heterostructure laser improves the dimensional accuracy of the active region. Additionally, using micro-selective area growth forms the optical waveguide core mesa without the need to etch through the active region. However, a second micro-selective area growth process is used to cover optical waveguide core mesa 80 with p-type cladding material. The second micro-selective area growth process involves removing the wafer from the growth chamber and etching mask patterns 84 to increase the width of window 82. FIG. 2B shows narrowed mask patterns 88 and widened window 86 resulting from etching the mask patterns 84 shown in FIG. 2A.

The wafer is then returned to the growth chamber and a p-type cladding mesa 90 is grown over optical waveguide core mesa 80, as shown in FIG. 2C Cladding mesa 90 is grown by micro-selective area growth in the widened window 86 defined by narrowed mask patterns 88 on the surface of n-type cladding layer 62. Cladding mesa 90 has a trapezoidal cross-sectional shape and covers the sidewalls and top surface of optical waveguide core mesa 80.

Accordingly, although using micro-selective area growth to fabricate a buried heterostructure optoelectronic device obviates the need to etch through the active region itself, using a micro-selective area growth process that involves an intervening etch process, as disclosed by Kudo et al., does not provide a complete solution to the problems described above. The need to remove the wafer from the growth chamber to etch the mask patterns exposes the sidewalls of the optical waveguide core mesa to ambient air and, hence, to the possibility of stable oxide formation or other damage to the sidewalls. Additionally, the sidewalls of the optical waveguide core mesa are exposed to the etchant used to etch the mask patterns. This can result in stable oxide formation on, or other damage to, the sidewalls of the optical waveguide core mesa, especially when the quantum well structure contains aluminum. The devices disclosed by Kudo et al. had quantum well layers of InGaAsP.

Moreover, the optoelectronic devices fabricated by the process disclosed by Kudo et al. have a high inter-electrode capacitance because an appreciable area of cladding mesa 90 abuts n-type cladding layer 62. Finally, cladding mesa 90 has a relatively narrow top surface on which it is difficult to form the p-contact electrode.

Further, in many applications it is desirable to use a distributed feedback (DFB) laser for its spectral purity and single mode output characteristics. However, fabricating a DFB laser is challenging because a diffraction grating structure must be formed in the vicinity of the active region. Typically, the grating is formed over the layers that comprise the active region of the device. When fabricating a laser device using the micro-selective area growth (μSAG) technique described in above-identified U.S. patent application Ser. No. 10/787,349, the diffraction grating must be formed under the active region. Forming the diffraction grating under the active region is difficult because it is difficult to planarize the surface of the grating so that the layers that form the active region can be grown over the diffraction grating.

Thus, what is needed is a way of fabricating optical waveguides and optoelectronic devices incorporating a buried heterostructure lateral waveguide structure that does not have the disadvantages of the buried heterostructure fabrication processes described above and that can be used to fabricate a DFB laser, or another device that uses distributed feedback. What is also needed is a way of fabricating buried heterostructure optical waveguides and optoelectronic devices whose optical waveguide cores include aluminum. Finally, what is needed are optical waveguides and optoelectronic devices incorporating a buried heterostructure lateral waveguide structure that does not have the disadvantages of the buried heterostructure lateral waveguide structures described above.

SUMMARY

The invention provides in a first aspect an optical waveguide or optoelectronic device that comprises a growth surface, a growth mask, an optical waveguide core mesa and a cladding layer. The growth mask is located on the growth surface and defines an elongate growth window and a periodic grating profile. The optical waveguide core mesa is located in the growth window and has a trapezoidal cross-sectional shape. The cladding layer covers the optical waveguide core mesa and extends over at least part of the growth mask.

The invention provides in a second aspect a device fabrication method in which a growth chamber is provided, a wafer having a growth surface is provided, a growth mask is formed on the growth surface, the growth mask defining an elongate growth window having a periodic grating profile, and a fabrication process is performed in the growth chamber. The fabrication process comprises growing an optical waveguide core mesa on the growth surface by micro-selective area growth, and, without removing the wafer from the growth chamber after fabricating the optical waveguide core mesa, covering the optical waveguide core mesa with cladding material.

The cladding material is grown without removing the substrate from the growth chamber by growing the cladding material under growth conditions in which the cladding layer material grows on the sidewalls of the optical waveguide core mesa in addition to the top surface of the mesa without the need to perform an etch process prior to growing the cladding material. The cladding material covering the optical waveguide core mesa protects the sidewalls of the optical waveguide core mesa from etchants and atmospheric contamination when the device is eventually removed from the growth chamber for further processing.

The invention provides in a third aspect a device fabrication method in which a wafer having a growth surface is provided, an optical waveguide core mesa is grown on the growth surface by micro-selective area growth at a first growth temperature and the optical waveguide core mesa is covered with cladding material at a second growth temperature, lower than the first growth temperature.

Covering the optical waveguide core mesa with the cladding material at the lower growth temperature allows the cladding material to grow on the sidewalls of the optical waveguide core mesa without the need to perform an etch process prior to growing the cladding material.

BRIEF DESCRIPTION OF THE DRAWINGS

FIGS. 1A-1C illustrate the fabrication of a first type of prior art optoelectronic device incorporating a buried heterostructure optical waveguide.

FIGS. 2A-2C illustrate the fabrication of a second type of prior art optoelectronic device incorporating a buried heterostructure optical waveguide.

DETAILED DESCRIPTION

The invention is based on the realization that the problems arising from exposing an optical waveguide core mesa grown by micro-selective area growth to an etchant and/or the atmosphere can be avoided by not widening the mask window before growing the p-type cladding layer. Instead, in accordance with the invention, the p-type cladding layer is grown over the optical waveguide core mesa and the mask having a periodic grating profile under growth conditions that cause the p-type cladding layer material to grow on the sidewalls of the optical waveguide core mesa in addition to the top surface thereof. In accordance with an embodiment of the invention, after a thin layer of p-type cladding layer material has been grown on the top surface of the optical waveguide core mesa, the growth temperature is reduced to one at which the surface migration length of the p-type cladding material is less than the width of the sidewalls of the mesa. Under these growth conditions, the p-type cladding layer material grows not only on the top surface of the optical waveguide core mesa, but also on the sidewalls. This way, a p-type cladding layer that covers the sidewalls of the optical waveguide core mesa is grown before the wafer is exposed to an etchant and/or to the atmosphere or is subject to conditions that could otherwise damage the sidewalls of the optical waveguide core mesa.

FIGS. 3A-3G illustrate an exemplary embodiment of a method in accordance with the invention for making a device. In the example shown, an optoelectronic device is fabricated. Hundreds or thousands of optoelectronic devices are made at a time on a single wafer. The wafer is then singulated to yield the individual optoelectronic devices. Other embodiments of the method fabricate transparent waveguide devices, such as buried heterostructure optical waveguides.

Figure 3A:
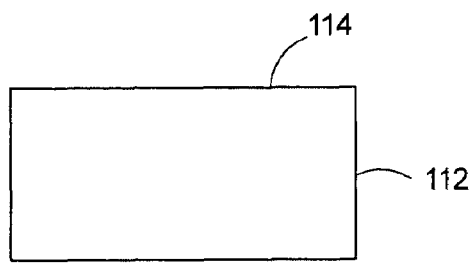
FIGS. 3A-3G illustrate the fabrication of an optoelectronic device incorporating a buried heterostructure optical waveguide in accordance with an embodiment of the invention.

FIG. 3A is a side view of the small portion of a wafer 110 (FIG. 3D) that constitutes the substrate 112 of an exemplary one of the optoelectronic devices fabricated on the wafer. The crystalline orientation on the major surface 114 of wafer 110 is [100]. In an exemplary embodiment, the material of the wafer is n-type indium phosphide (InP).

Figure 3B:
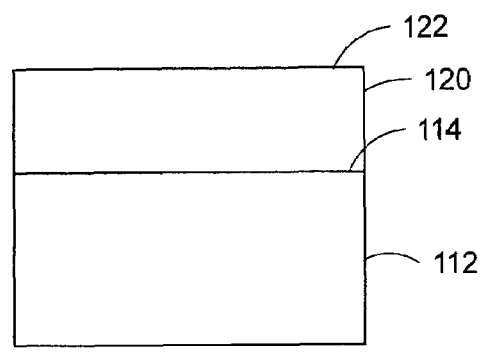

Wafer 110 is mounted on the susceptor (not shown) of a metal-organic chemical vapor deposition (MOCVD) growth chamber (not shown) and an n-type cladding layer 120 of n-type indium phosphide is grown on major surface 114, as shown in FIG. 3B. The n-type cladding layer is grown to a thickness of about 2 μm. The exposed major surface of n-type cladding layer 120 provides a growth surface 122 on which an optical waveguide core mesa is grown.

Figure 3C:
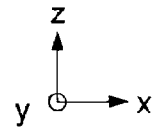
Figure 3C:
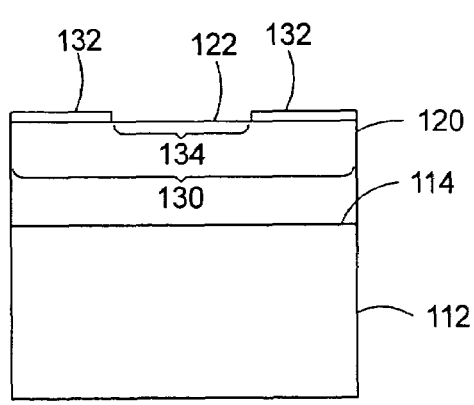

A mask layer (not shown) is then deposited on growth surface 122. In an embodiment, the material of the mask layer was silicon dioxide ($SiO_2$). Wafer 110 is then removed from the growth chamber, and is subject to photolithography and etching to pattern the mask layer to define a growth mask 130, as shown in FIG. 3C.

Figure 3D:
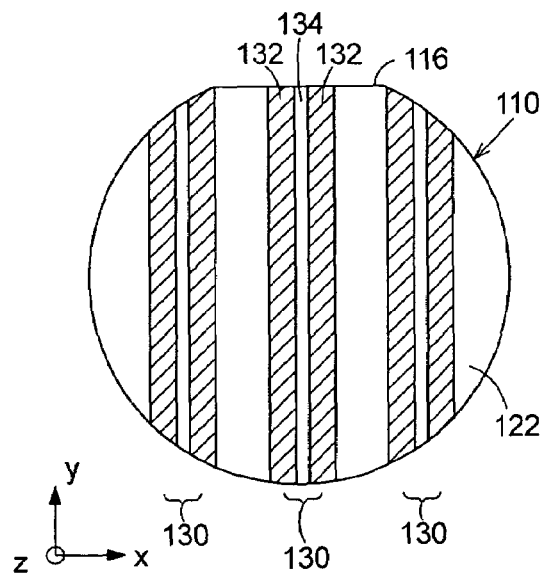

FIG. 3D is a plan view of wafer 110 showing growth masks 130 arrayed on the growth surface 122 of n-type cladding layer 120 (FIG. 3C) grown on the wafer. Each growth mask is composed of a pair of mask stripes 132. FIG. 3D is highly simplified in the sense that it shows only three growth masks. In a practical embodiment, each growth mask 130 is about 10-25 μm wide, and adjacent growth masks are separated by a distance in the range from about 100 μm to about 500 μm across the width of the wafer, so a typical wafer has hundreds of growth masks arrayed on its surface. A flat 116 indicates the orientation of the [0-1-1] normal to the crystalline plane of the wafer.

Mask stripes 132 are elongate and have their long sides aligned parallel to the [011] crystalline direction of growth surface 122, which is aligned in the y-direction shown. Each pair of adjacent ones of mask stripes 132 constitutes a growth mask 130 that defines an elongate growth window 134 in which an elongate waveguide core mesa will be grown by micro-selective area growth. The width of the growth window, defined by the distance in the x-direction between the opposed edges of the pair of the mask stripes 132, is in the range from about 1 μm and about 3 μm, and is typically in the range from about 1.5 μm to about 2 μm. The actual width of growth window 134 depends on the specified width of the quantum well structure of the optoelectronic device being made, i.e., the specified dimension in the x-direction of the quantum well structure.

Wafer 110 is returned to the MOCVD growth chamber, and optical waveguide core mesa 140 is grown in growth window 134 using micro-selective area growth. In the example of the optoelectronic device shown, optical waveguide core mesa 140 is structured to provide the active region of the optoelectronic device, and is composed of, in order from growth surface 122, an n-type buffer layer, a hole blocking layer, a substrate-side separation layer, a quantum well structure, a remote-side separation layer and an electron blocking layer. The structure of the optical waveguide core mesa will be described in detail below with reference to FIG. 4B. At least one quantum well, composed of a quantum well layer (also shown in FIG. 4B) sandwiched between two barrier layers (also shown in FIG. 4B) is located in the quantum well region. In a transparent waveguide device, optical waveguide core mesa 140 is homogeneous and lacks the layers shown in FIG. 4B.

During the growth of optical waveguide core mesa 140 by micro-selective area growth, semiconductor material formed from the precursors fed to the MOCVD growth chamber alights on growth mask 130. This semiconductor material does not nucleate on the growth mask, but migrates towards the portion of growth surface 122 exposed in growth window 134. The semiconductor material growing in the growth window has a strong tendency to form a [111] sidewall on which the growth rate is approximately zero. Accordingly, the semiconductor material grows predominantly on the top surface 146 of optical waveguide core mesa 140, and the optical waveguide core mesa grows in growth window 134 with the trapezoidal cross-sectional shape shown in FIG. 3E. The optical waveguide core mesa is bounded by straight, smooth, [111] sidewalls 144.

Figure 3E:
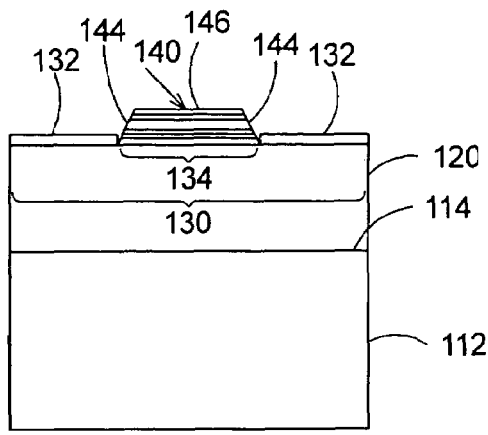
Figure 3F:
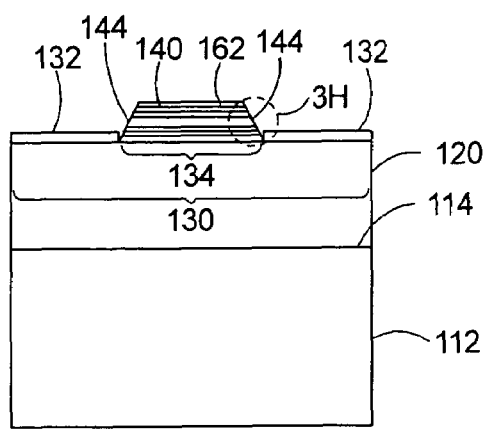

Growth of optical waveguide core mesa 140 is performed at a growth temperature at which the adatoms of the semiconductor material have sufficient mobility that their surface diffusion length is greater than the width w (FIG. 3H) of the [111] surfaces constituting sidewalls 144. As long as the surface diffusion length is greater than the width of sidewalls 144, substantially no semiconductor material grows on the sidewalls.

Optical waveguide core mesa 140 is grown until it reaches its specified thickness. Then, the precursors fed to the growth chamber are changed to those for the p-type cladding layer material and the growth temperature is reduced slightly relative to that used to grow the optical waveguide core mesa. However, the reduced temperature is still above the temperature at which the surface diffusion length of the adatoms of the semiconductor material is greater than the width of sidewalls 144. Consequently, a thin sublayer 162 of the p-type cladding layer grows on the top surface of optical waveguide core mesa 140, as shown in FIG. 3F.

After sublayer 162 of the p-type cladding layer has reached a thickness of a few tens of nanometers, the growth temperature is reduced to one at which the mobility of the adatoms of semiconductor material is such that their surface diffusion length is less than the width of sidewalls 144. Micro-selective area growth continues at the reduced growth temperature, and the semiconductor material continues not to nucleate on growth mask 130. However, at the reduced growth temperature, growth no longer predominantly occurs on the top surface 146 of optical waveguide core mesa 140. Consequently, the remainder of p-type cladding layer 160 grows on the sidewalls 144 of optical waveguide core mesa 140 in addition to growing on top surface 146.

Figure 3G:
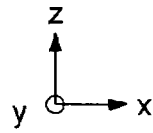
Figure 3G:
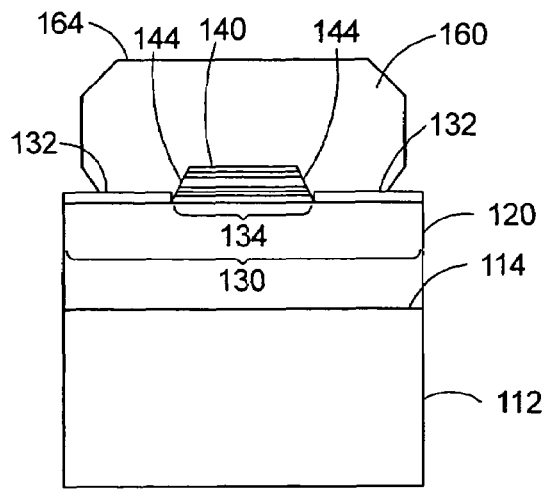
Figure 3H:
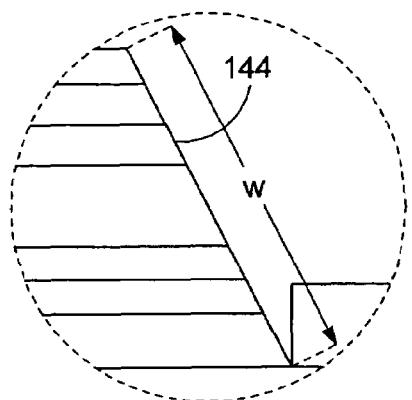
FIG. 3H is an enlarged view of part of FIG. 3F showing one sidewall of the optical waveguide core mesa.

Growth of p-type cladding layer 160 at the reduced growth temperature is continued until the p-type cladding layer reaches its specified thickness, as shown in FIG. 3G. As the p-type cladding layer grows on sidewalls 144, it additionally extends laterally over part of growth mask 130. The p-type cladding layer forms a plane major surface 164 to which an electrode can later be applied.

After growth of p-type cladding layer 160 has been completed, wafer 110 is removed from the growth chamber. P-type cladding layer 160 covers the sidewalls 144 of optical waveguide core mesa 140 and therefore protects the sidewalls from the environment. Accordingly, the p-type cladding layer protects the sidewalls from damage during subsequent processing applied to the wafer, such as electrode application, electrode patterning and singulation.

Figure 4A:
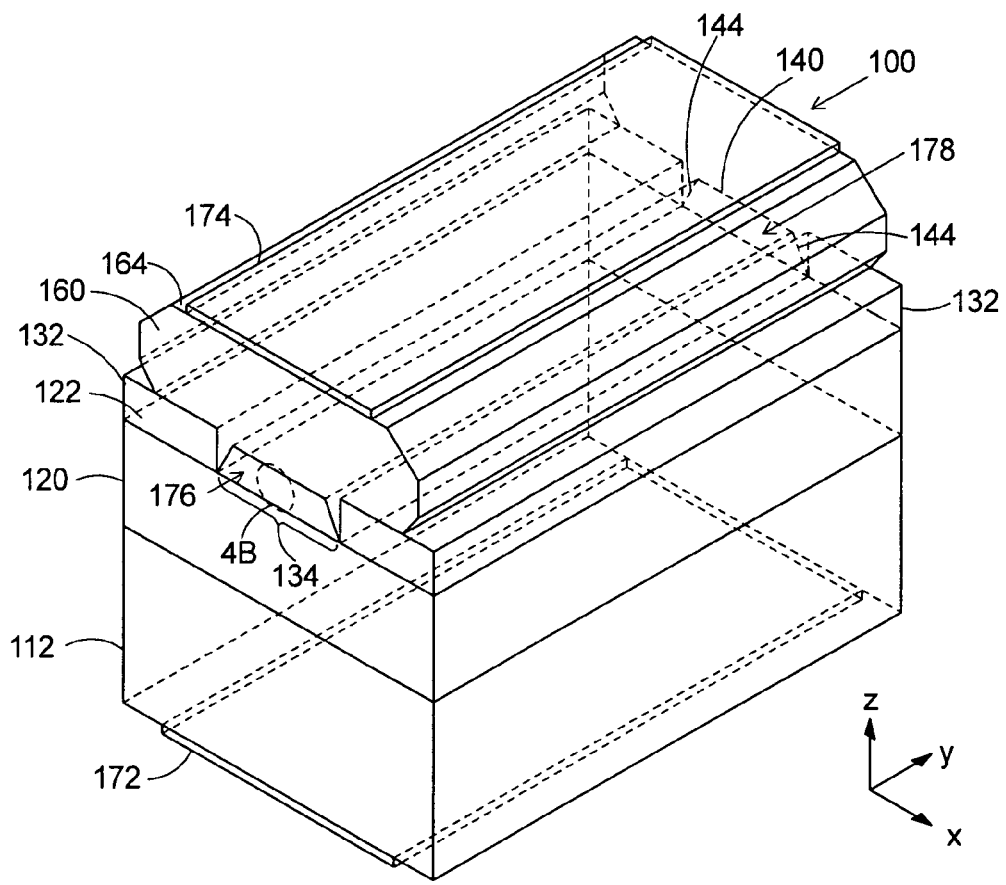
FIG. 4A is an isometric view of an exemplary embodiment of an optoelectronic device incorporating a buried heterostructure optical waveguide in accordance with the invention.
Figure 4B:
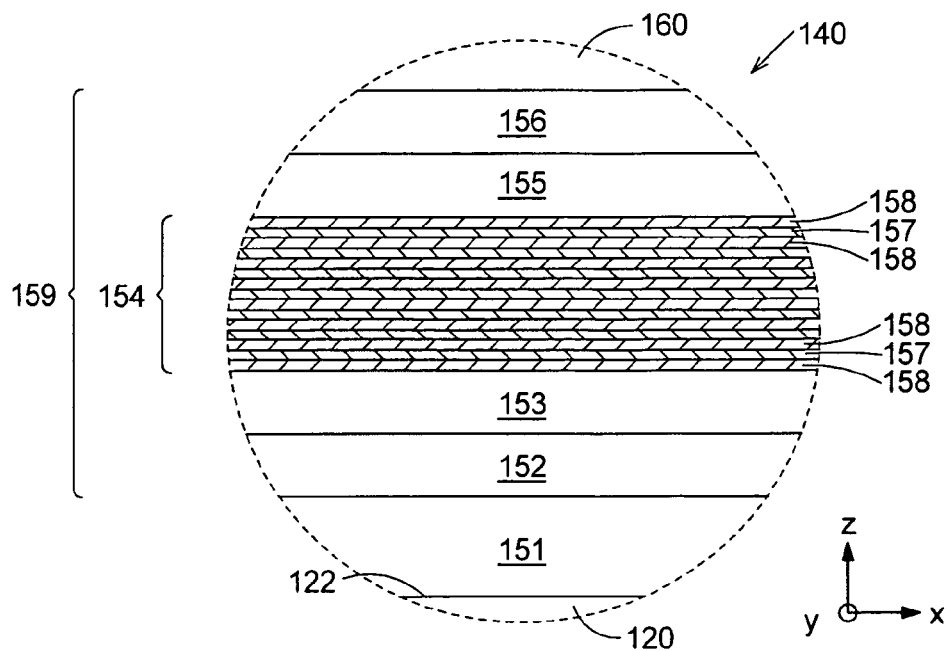
FIG. 4B is an enlarged view of showing the structure of the optical waveguide core mesa of the exemplary optoelectronic device shown in FIG. 4A.

FIG. 4A is an isometric view of an exemplary embodiment of an optoelectronic device 100 in accordance with the invention fabricated by the above-described fabrication method in accordance with the invention. FIG. 4A does not show the layer structure of the optical waveguide core mesa of optoelectronic device 100 to simplify the drawing. FIG. 4B is an enlarged view of part of optoelectronic device 100 showing the layer structure of the optical waveguide core mesa.

Referring first to FIG. 4A, optoelectronic device 100 is composed of a growth surface 122, a growth mask 130, an optical waveguide core mesa 140 and a cladding layer 160. Growth mask 130 is located on growth surface 122 and defines an elongate growth window 134. Optical waveguide core mesa 140 is located in the growth window and has a trapezoidal cross-sectional shape. Cladding layer 160 covers optical waveguide core 140 and at least part of growth mask 130.

In the example shown, growth surface 122 is the major surface of an n-type cladding layer 120 epitaxially grown on a substrate 112. In an embodiment, the material of substrate 112 is single-crystal n-type indium phosphide (hiP), n-type cladding layer 120 is a layer of n-type InP and has a thickness of about 2 μm, and growth surface 122 has a [100] crystalline orientation.

In the example shown, growth mask 130 is composed of elongate, rectangular mask stripes 132. Mask stripes 132 are regions of silicon dioxide ($SiO_2$) having opposed parallel edges that define elongate growth window 134. Growth window 134 has a width in the range from about 1 μm to about 3 μm, and typically in the range from about 1.5 μm to about 2 μm. The actual width of the growth window is determined by the specified width of the quantum well region (154 in FIG. 4B), the distance between growth surface 122 and the quantum well region, and the angle between sidewalls 144 and growth surface 122. Mask stripes 132 each have a width in the range from about 3 μm to about 11 μm. In the example shown, mask stripes 132 have a thickness of about 500 nm, which is similar (±150 nm) to the height of optical waveguide core mesa 140. The opposed edges of the growth stripes are aligned parallel to the [011] crystalline direction of growth surface 122.

An alternative material of growth mask 130 is silicon nitride $Si_3N_4$.

Optical waveguide core mesa 140 is located on the growth surface 122 of n-type cladding layer 120 in growth window 134 defined by growth mask 130. Optical waveguide core mesa is composed of one or more layers of one or more semiconductor materials having a higher refractive index than either of n-type cladding layer 120 and p-type cladding layer 160. In an embodiment, the refractive index contrast between optical waveguide core mesa 140 and cladding layers 120 and 160 was about −0.2. Optical waveguide core mesa 140 has a trapezoidal cross-sectional shape as a result of its fabrication by micro-selective area growth that forms [111] surfaces that constitute its sidewalls 144.

P-type cladding layer 160 covers optical waveguide core mesa 140 and at least part of growth mask 130. In particular, cladding layer 160 contacts sidewalls 144 of optical waveguide core mesa 140. In the example shown, the material of cladding layer 160 is p-type InP. Optical waveguide core mesa 140 is thus surrounded by n-type cladding layer 120 and p-type cladding layer 160, which have a lower refractive index than the materials of the optical waveguide core mesa. Thus, optical waveguide core mesa 140 and cladding layers 120 and 160 collectively constitute an optical waveguide.

In the example shown, optical waveguide core mesa 140 is structured to provide the active region of optoelectronic device 100. FIG. 4B shows the structure of an example of such an optical waveguide core mesa 140 composed of, in order, an n-type buffer layer 151, a hole blocking layer 152, a substrate-side separation layer 153, a quantum well structure 154, a remote-side separation layer 155 and an electron blocking layer 156. N-type buffer layer 151 is located on the growth surface 122 of n-type cladding layer 120. Blocking layers 152 and 156 are layers of semiconductor materials significantly higher in band gap energy than the semiconductor materials of separation layer 153 and 155. The structure composed of hole blocking layer 152, separation layers 153 and 155 and electron blocking layer 156 forms a separate confinement heterostructure (SCH) 159 that confines current carriers (i.e., electrons and holes) to quantum well structure 154.

N-type buffer layer 151 is a layer of n-type InP about 100 nm thick grown in growth window 134 on growth surface 122 of n-type cladding layer 120.

Hole blocking layer 152 is a layer of n-type semiconductor material having a band gap energy higher than the materials of the adjacent layers, i.e., n-type buffer layer 151 and substrate-side separation layer 153. In an embodiment, hole blocking layer 152 was a layer of n-type aluminum indium arsenide (AlInAs) about 40 nm thick.

Substrate-side separation layer 153 is a layer of a semiconductor material having a band gap energy similar to that of the barrier layers of quantum well structure 154. No dopant was added to the material of the substrate-side separation layer during growth. In an embodiment, substrate-side separation layer 153 was a layer of AlGaInAs with Al, Ga and In fractions of 0.325, 0.175 and 0.5, respectively, about 50 nm thick.

Quantum well structure 154 is composed of N quantum well layers 157 interleaved with N+1 barrier layers 158, where N is a positive integer. In the example shown, N=7. The material of the quantum well layers has a substantially lower band gap energy that that of the barrier layers. No dopant is added to the materials of the quantum well structure during growth. In an embodiment, quantum well structure 154 was composed of seven quantum well layers 157, each about 9 nm thick, and eight barrier layers 158, each about 8 nm thick. The material of quantum well structure 154 was AlGaInAs with Al, Ga and In fractions of 0.18, 0.22 and 0.6, respectively, in quantum well layers 157 and 0.32, 0.22 and 0.46, respectively, in barrier layers 158.

Remote-side separation layer 155 is a layer of a semiconductor material having a band gap energy similar to that of barrier layers 158 of quantum well structure 154. No dopant is added to the material of the remote-side separation layer during growth. In an embodiment, remote-side separation layer 155 was a layer of AlGaInAs with Al, Ga and In fractions of 0.325, 0.175 and 0.5, respectively, about 50 nm thick.

Electron blocking layer 156 is a layer of p-type semiconductor material having a band gap energy higher than that of the materials of the adjacent layers, i.e., remote-side separation layer 155 and p-type cladding layer 160. In an embodiment, electron blocking layer 156 was a layer of p-type aluminum indium arsenide (AlInAs) about 40 nm thick.

Referring again to FIG. 4A, optoelectronic device 100 additionally has an electrode 172 located on the surface of substrate 112 remote from n-type cladding layer 120, an electrode 174 located on the surface 164 of p-type cladding layer 160, and opposed facets 176 and 178 disposed orthogonally to the long axis of optical waveguide core mesa 140. Facets 176 and 178 are typically formed by cleaving. In an embodiment of optoelectronic device 100 in which facets 176 and 178 are highly reflective, current flowing between electrodes 174 and 172 causes optoelectronic device 100 to operate as a laser and generate coherent light that is emitted through the facets. In an embodiment of optoelectronic device 100 in which facets 176 and 178 are coated with anti-reflective material, current flowing between electrode 174 and 172 causes optoelectronic device 100 to operate as an optical gain medium and generate light that is emitted through the facets. In another embodiment of optoelectronic device 100 in which facets 176 and 178 are coated with anti-reflective material, a voltage applied between electrode 172 and 174 causes optoelectronic device 100 to operate as an optoelectronic modulator with respect to light passing through the optical waveguide of which optical waveguide core mesa 140 forms part.

In optoelectronic device 100, n-type cladding layer 120, p-type cladding layer 160 and growth mask 130 form a capacitor that is a major contributor to the inter-electrode capacitance of optoelectronic device 100, i.e., the capacitance between electrodes 172 and 174. The growth mask constitutes the dielectric of the capacitor. Mask stripes 132 as thin as about 50 nm will reliably cover growth surface 122, and will therefore operate effectively as growth mask 130 in the micro-selective area growth process described above. However, using a thin growth mask can result in a high inter-electrode capacitance that limits the maximum modulation speed of the optoelectronic device. In the example of optoelectronic device 100 shown, growth mask 130 has a thickness greater than the minimum thickness required to cover growth surface 122 reliably. A thickness similar to that of optical waveguide core mesa 140, i.e., a thickness of about (500±~150) nm, reduces the inter-electrode capacitance of optoelectronic device 100 to a level comparable with that of a conventional buried heterostructure optoelectronic device with a 3 µm-thick InP:Fe cap layer. Such devices can be modulated at modulation speeds greater than 10 Gb/s.

Part of p-type cladding layer 160 abuts n-type buffer layer 151 and n-type hole blocking layer 152 (FIG. 4B). However, this arrangement does not divert current away from quantum well structure 154 because the turn-on voltage the p-n junction between the p-type cladding layer and the n-type portions of optical waveguide mesa 140 type is greater than that of the p-i-n junction that includes the quantum well structure.

Fabrication of optoelectronic device 100 shown in FIG. 4A will now be described in more detail with reference once again to FIGS. 3A-3H.

Referring first to FIG. 3A, substrate 112 is part of a wafer 110 (FIG. 3D) of n-type InP a few hundred micrometers thick. The material of the substrate is typically doped with sulfur (S). The crystalline orientation on the major surface 114 of the substrate is [100].

Whereas the material of substrate 112 is nominally the same as that of n-type cladding layer 120 (FIG. 3B), its crystalline quality and purity is typically below that needed in the cladding layer of an optoelectronic device. Accordingly, wafer 110 is mounted on the susceptor in an MOCVD growth chamber and n-type cladding layer 120 is epitaxially grown on the major surface 114 of substrate 112 at a growth temperature of about 640° C. N-type cladding layer is a layer of InP doped n-type with silicon. Typical precursors used to grow the n-type cladding layer are trimethylindium ($(CH_3)_3In$) and phosphine ($PH_3$) with disilane ($Si_2H_6$) as the silicon precursor. Growth continues until n-type cladding layer 120 reaches a thickness of about 2 µm. The surface of n-type cladding layer provides growth surface 122 whose crystalline orientation is [100].

If InP wafers with a crystalline quality and purity comparable with that of an epitaxially-grown layer are available, substrate 112 can serve as the n-type cladding layer of the optoelectronic device. In this case, no n-type cladding layer need be epitaxially grown on the substrate, and major surface 114 of the substrates provides the growth surface 122 on which optical waveguide core mesa 140 is grown by micro-selective area growth.

A mask layer (not shown as such) is then deposited on growth surface 122. In the example shown, the mask layer is deposited on the surface of n-type cladding layer 120. In an embodiment, the material of the mask layer was silicon dioxide ($SiO_2$) formed using silane and oxygen as precursors. As noted above, the mask layer is typically deposited with a thickness of several hundred nanometers to reduce the inter-electrode capacitance of the optoelectronic device. This thickness is considerably thicker than the minimum thickness needed to reliably cover growth surface 122. In an embodiment, the mask layer had a thickness of 500 nm.

Wafer 110 is then removed from the growth chamber, and is subject to photolithography and etching to pattern the mask layer to define the mask stripes 132 shown in FIGS. 3C and 3D. Adjacent ones of the mask stripes collectively constitute a growth mask 130 that defines elongate growth window 134 on growth surface 122. Adjacent ones of the mask stripes 132 are separated by a distance, and, hence, growth window 134 has a width, in the range from about 1 µm and about 3 µm, and typically in the range from about 1.5 µm-2 µm.

Mask stripes 132 have a width in the range from about 3 µm to about 11 µm, and typically in the range from about 5 µm to about 11 µm. Since semiconductor material that alights on growth mask 130 migrates towards the top surface 146 of optical waveguide core mesa 140 (FIG. 3E) growing in growth window 134, mask stripes that are too wide result in a growth rate that is so fast that the thickness of the grown material is difficult to control. A high rate of growth is especially problematical towards the end of the process of growing the optical waveguide core mesa because the top surface 146 of the mesa is small in area. Consequently, so the growth rate is large and accelerating. On the other hand, mask stripes 132 that are too narrow allow the p-type cladding layers 160 grown on the optical waveguide core mesas in adjacent growth windows 134 to merge, which is also undesirable.

Once growth masks 130 have been formed, wafer 110 is returned to the growth chamber. The wafer is heated to a growth temperature of about 640° C. and optical waveguide core mesa 140 is grown by micro-selective area growth in growth window 134 defined on growth surface 122 by growth mask 130. Growth of an embodiment of optical waveguide core mesa 140 having the layer structure shown in FIG. 4B will be described.

N-type buffer layer 151 is a layer of InP grown on growth surface 122. In the example shown, growth surface 122 is the surface of n-type cladding layer 120. The n-type buffer layer is doped n-type with silicon. Typical precursors used to grow the n-type buffer layer are trimethylindium ($(CH_3)_3In$) and phosphine ($PH_3$) with disilane ($Si_2H_6$) as the silicon precursor. Growth continues until n-type buffer layer 151 reaches a thickness of about 100 nm.

N-type buffer layer 151 is made as thin as possible to reduce the total thickness of optical waveguide core mesa 140. Reducing the thickness of mesa 140 reduces the maximum growth rate of the mesa, i.e., the growth rate during deposition of sublayer 162 of p-type cladding layer 160 when the area of the top surface 146 of the mesa is a minimum. It is desirable to reduce the maximum growth rate to enhance control of the layer thickness and to maximize the crystalline quality of the material grown. Material that grows at a high growth rate can be of low crystalline quality because of strain.

In an embodiment in which the process of defining growth mask 130 in a layer of mask material does not degrade the crystalline quality of growth surface 122 and leaves no residue of the mask material in growth window 134, n-type buffer layer 151 need not be grown. In this case, hole blocking layer 152 is grown directly on growth surface 122. Omitting n-type buffer layer 151 desirably reduces the thickness of optical waveguide core mesa 140.

The supply of phosphine to the growth chamber is cut off, and supplies of trimethylaluminum ($(CH_3)_3Al$) and arsine ($AsH_3$) are commenced to grow hole blocking layer 152 of AlInAs on n-type buffer layer 151 (or on growth surface 122, as noted above). The precursor flow rates are adjusted to produce the AlInAs with an aluminum fraction that provides lattice matching between the hole blocking layer and the InP of n-type buffer layer 151. Growth continues until hole blocking layer 152 reaches a thickness of about 40 nm.

A supply of trimethylgallium (($CH_3$)$_3$Ga) is commenced to grow substrate-side separation layer 153 of AlGaInAs on hole blocking layer 152. The precursor flow rates are adjusted to produce the AlGaInAs with Al, Ga and In fractions of 0.325, 0.175 and 0.5, respectively. Material of this composition is lattice matched to InP. No dopant is added to the material of the substrate-side separation layer during growth. Growth continues until substrate-side separation layer 153 reaches a thickness of about 50 nm.

Quantum well structure 154 is grown next. The precursor flow rates are first adjusted to grow a barrier layer 158 on substrate-side separation layer 153. Barrier layer 158 is a layer of AlGaInAs with Al, Ga and In fractions of 0.32, 0.22 and 0.46, respectively. Material of this composition has a band gap energy similar to that of the AlGaInAs of substrate-side separation layer 153 but has a different lattice constant so that the barrier layer is strained. No dopant is added to the material of the quantum well structure during growth. Growth continues until barrier layer 158 reaches a thickness of about 8 nm.

The precursor flow rates are then adjusted to grow a quantum well layer 157 on barrier layer 158. Quantum well layer 157 is a layer of AlGaInAs with Al, Ga and In fractions of 0.18, 0.22 and 0.6, respectively. Material with this composition has a band gap energy substantially lower than that of barrier layer 158. Such material also has a lattice constant that differs from that of the AlGaInAs of the substrate-side separation layer in the opposite direction from that of barrier layer 158 so that the quantum well layer is also strained. Growth continues until quantum well layer 157 reaches a thickness of about 9 nm.

The process, similar to that just described, of growing a barrier layer 158 followed by a quantum well layer 157 is repeated six times to grow a total of seven barrier layers and seven quantum well layers. The process, similar to that just described, of growing a barrier layer 158 is performed once to grow an eighth barrier layer. This completes growth of quantum well structure 154.

The precursor flow rates are then adjusted to grow remote-side separation layer 155 on quantum well structure 154. The precursor flow rates are adjusted to produce AlGaInAs with Al, Ga and In fractions of 0.325, 0.175 and 0.5, respectively. Material of this composition is lattice matched with InP, but is mis-matched with barrier layer 158. No dopant is added to the material of the remote-side separation layer during growth. Growth continues until remote-side separation layer 155 reaches a thickness of about 50 nm.

The supply of trimethylgallium to the growth chamber is cut off, and a supply of dimethylzinc (($CH_3$)$_2$Zn) is commenced to grow electron blocking layer 156 of p-type AlInAs on remote-side separation layer 155, as shown in FIG. 3E. The precursor flow rates are adjusted to produce the AlInAs with an aluminum fraction that provides lattice matching to InP. Growth continues until electron blocking layer 156 reaches a thickness of about 40 nm. This completes fabrication of optical waveguide core mesa 140.

The supplies of trimethylaluminum and arsine ($AsH_3$) to the growth chamber are cut off, a supply of phosphine ($PH_3$) is commenced, and the growth temperature is reduced to about 620° C. to grow sublayer 162 of p-type cladding layer 160, as shown in FIG. 3F. Sublayer 162 is a thin layer of p-type InP and is grown on electron blocking layer 156 by micro-selective area growth. Sublayer 162 grows on the top surface 146 of optical waveguide core mesa 140.

The reduced growth temperature used to grow sublayer 162 of p-type cladding layer is still above the temperature at which the adatoms of the semiconductor material have sufficient mobility that their surface diffusion length is greater than the width w (FIG. 3H) of the [111] surfaces constituting sidewalls 144. Thus, sublayer 162 grows predominantly on the top surface of optical waveguide core mesa 140 as just described. The growth temperature of about 620° C. can be used because the material being grown lacks aluminum. There is therefore is no need use a growth temperature of about 640° C., which is needed when growing aluminum-containing materials to prevent aluminum from sticking to growth mask 130. The growth temperature of 620° C. is intermediate between the growth temperature used to grow optical waveguide core mesa 140 and the growth temperature used below to grow the remainder of p-type cladding layer 160. Growth of sublayer 162 continues until it reaches a thickness of a few tens of nanometers. In an embodiment, growth continued until sublayer 162 reached a thickness of about 40 nm.

The growth temperature is then reduced to about 600° C. As the temperature falls, the adatoms of semiconductor material reduce in mobility so that their surface diffusion length becomes less than the width of the [111] surfaces constituting sidewalls 144. At the reduced growth temperature, micro-selective area growth continues but growth no longer occurs predominantly on the top surface 140 of optical waveguide core mesa 140. Instead, p-type cladding layer 160 additionally grows on the sidewalls 144 of the mesa. Growth of p-type cladding layer 160 at the reduced growth temperature continues until the p-type cladding layer reaches its specified thickness, as shown in FIG. 3G. In an embodiment, growth continued until p-type cladding layer 160 reached a thickness of 2 μm.

After the growth of p-type cladding layer 160 has been completed, wafer 110 is removed from the growth chamber. P-type cladding layer 160 covers the sidewalls 144 of optical waveguide core mesa 140 and extends over part of growth mask 130. Accordingly, the p-type cladding layer protects sidewalls 144 from damage during subsequent processing applied to the wafer. This processing includes deposition and patterning of electrodes 172 and 174, cleaving to form facets 176 and 178 and singulation into individual optoelectronic devices.

Embodiments of the invention are described above with reference to an example in which some of the semiconductor materials used to fabricate optical waveguide core mesa 140 comprise aluminum. However, this is not critical to the invention. None of the semiconductor materials used to fabricate the optical waveguide core mesa need comprise aluminum. For example, quantum well structure 154 may have quantum well layers 157 of InGaAsP. Lasers having such quantum well structures have a lower $T_0$ than those described above in which quantum well structure 154 has quantum well layers 157 of AlGaInAs.

Embodiments of the invention are described above with reference to examples in which optical waveguide core mesa 140 is structured to provide the active region of an optoelectronic device. However, embodiments of the invention are not limited to optoelectronic devices and their fabrication. The invention additionally encompasses transparent waveguide devices and their fabrication. Such embodiments of the invention provide transparent optical waveguides in which optical waveguide core mesa 140 has a trapezoidal cross-sectional shape but lacks the layer structure shown in FIG. 4B. Instead, the optical waveguide core mesa is structured as a homogeneous mesa of a semiconductor material having a refractive index higher than that of cladding layers 120 and 160. Examples of suitable semiconductor materials include AlInAs, AlGaInAs and InGaAsP.

Embodiments of the invention are described above with reference to examples in which the opposed edges of growth mask 130 are described as being aligned parallel to the [011] crystalline direction of growth surface 122. However, although optimum results are obtained with this alignment of the growth mask, micro-selective area growth is not critically dependent on alignment, and results that are acceptable for use in many applications are obtained notwithstanding a deviation from the parallel relationship described.

Figure 5A:
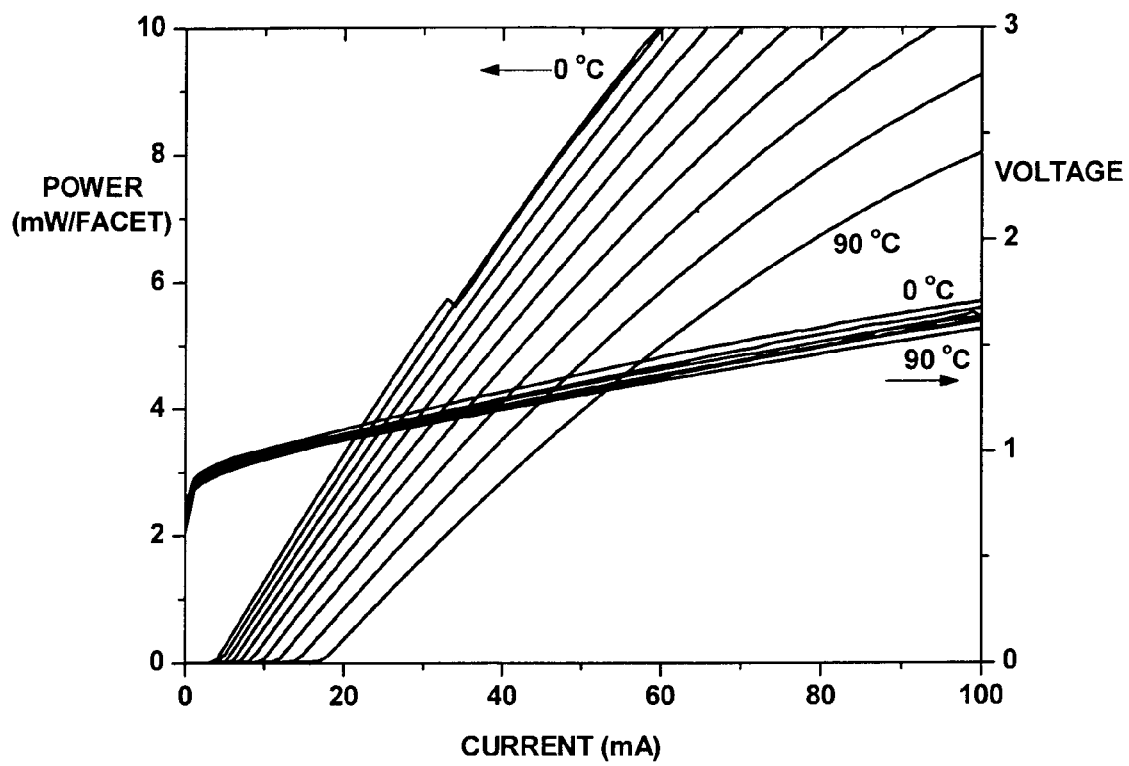
FIGS. 5A and 5B are graphs showing some performance characteristics of an embodiment of an optoelectronic device in accordance with the invention configured as a buried heterostructure laser.
Figure 5B:
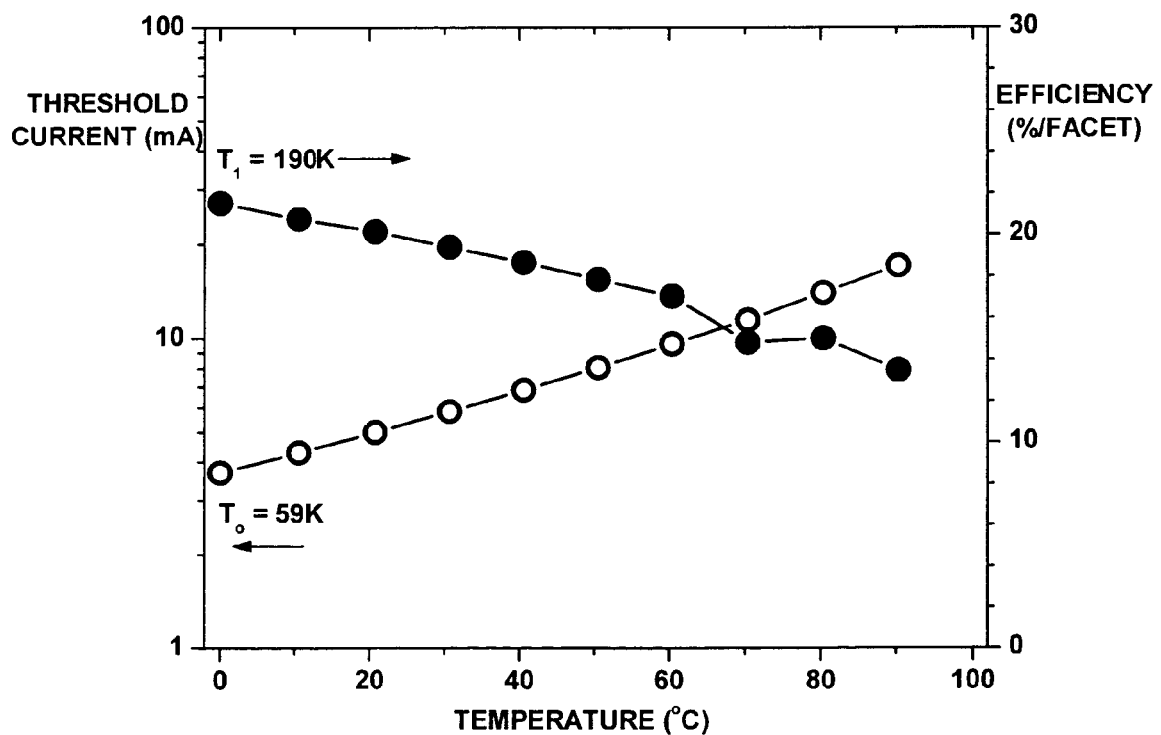

FIGS. 5A and 5B are graphs showing some performance characteristics of an embodiment of an optoelectronic device in accordance with the invention configured as a buried heterostructure laser. The laser generated light at a wavelength of 1350 nm and had a cavity length, i.e., distance between facets 176 and 178 (FIG. 4A), of 300 μm. The material of the quantum well structure was AlGaInAs.

FIG. 5A shows the variation of optical output power and forward voltage drop with current between electrodes 174 and 172 (FIG. 4A) at ten different temperatures, 0° C. through 90° C. in ten-degree intervals. The laser had a threshold current of less than 4 mA at 0° C. and less than 20 mA at a temperature of 90° C. The 0° C. threshold current is about 30% less than a conventional (FIG. 1A-1C) InGaAsP BH laser.

FIG. 5B shows the variation of c-w threshold current and differential quantum efficiency with temperature. The variation of both threshold current and efficiency with temperature is relatively small due to the higher characteristic temperatures obtained using AlGaInAs as the material of the quantum well structure. Sample lasers fabricated in accordance with the invention using AlGaInAs as the material of the quantum well structure had characteristic temperatures of $T_0$ (threshold current)=55° K and $T_1$ (efficiency)=190° K. An otherwise similar lasers fabricated in accordance with the invention using InGaAsP as the material of the quantum well structure had characteristic temperatures of $T_0$=45° K and $T_1$=145° K.

Figure 6:
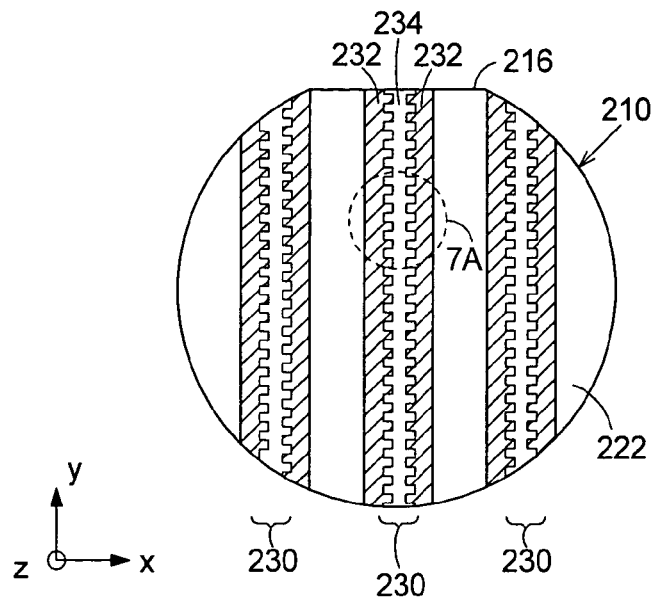
FIG. 6 is a plan view illustrating an embodiment of the invention in which the mask includes a periodic grating profile.

FIG. 6 is a plan view illustrating an embodiment of the invention in which the mask additionally defines a periodic grating profile. The wafer 210 includes growth masks 230 arrayed on the growth surface 222 of an n-type cladding layer grown on the wafer 210. Each growth mask 230 comprises a pair of mask stripes 232, similar to the mask stripes 132 described above. In this embodiment, the mask stripes 232 are formed to define a periodic grating profile, also referred to as a corrugation. The periodic grating profile can be formed in the mask stripes 232 by, for example, electron beam lithography, or another lithographic process capable of defining fine structural details. In one embodiment, the periodic grating profile is formed as a plurality of projections and recesses, the detail of which will be described below. However, other grating profiles can be formed.

Each growth mask 232 is about 3-25 μm wide, and adjacent growth masks are separated by a distance in the range from about 100 μm to about 500 μm across the width of the wafer 210, so a typical wafer has hundreds of growth masks 230 arrayed on its surface. Mask stripes 232 are elongate and, in a preferred embodiment, have their long sides aligned parallel to the [011] crystalline direction of growth surface 222, which is aligned in the y-direction shown. Each pair of adjacent ones of mask stripes 232 constitutes a growth mask 230 that defines an elongate growth window 234 in which an elongate optical waveguide core mesa will be grown by micro-selective area growth as described above. The width of the growth window 234, defined by the distance in the x-direction between the opposed edges of the pair of the mask stripes 232, is in the range from about 1 μm and about 3 μm, and is typically in the range from about 1.5 μm to about 2 μm. The actual width of growth window 234 depends on the specified width of the quantum well structure of the optoelectronic device being made, i.e., the specified dimension in the x-direction of the quantum well structure.

In accordance with this embodiment of the invention, the periodic nature of the projections and recesses in the mask stripes 232 produces a corresponding periodic variation of the effective refractive index for the guided fundamental optical mode in the optical waveguide core mesa. The periodic variation of the effective refractive index is also referred to as a refractive index modulation. The fundamental optical mode guided by the optical waveguide core mesa experiences a slight, periodic perturbation that is caused by the presence of the corrugated mask. Simulations indicate that the magnitude of this refractive index modulation is of the order of a few thousandths, which is suitable for forming a DFB reflection grating. The perturbation causes the fundamental optical mode within the optical waveguide core mesa 240 to function as a DFB laser. At a wavelength determined by the active region, the index difference caused by the periodic structure of the mask stripe 232 appears as a distributed Bragg reflector (DBR) to light traveling longitudinally in the optical waveguide core mesa, as long as the periodicity of the grating profile is set equal to a half wavelength or multiples of a half wavelength of light at the desired wavelength divided by the effective index of the waveguide mode. A DBR is formed by the periodic grating in each mask stripe 232.

To illustrate, assume the design wavelength of the light to be carried in the optical waveguide core mesa 240 is $\lambda_0$. The wavelength $\lambda_0$ is determined by the materials and the bandgap of the active region in the optical waveguide core mesa 240. The wavelength $\lambda_0$ is generally set near where the optical gain of the active region is at a maximum. The fundamental optical mode travels at a speed characterized by the effective refractive index, $\eta_{\textit{eff}}$. For the periodic nature of the mask stripes 232 to reflect light at $\lambda_0$, the grating period, Lg, is defined as $Lg=(\lambda_0/\eta_{\textit{eff}})*m/2$, where m is any positive integer and is typically equal to one (1). The effective refractive index $\eta_{\textit{eff}}$ of the optical waveguide core mesa 240 will vary along the longitudinal direction of the waveguide core mesa 240 between the effective refractive index at its narrowest point, $\eta_{\textit{eff0}}$, and the effective refractive index at its widest point, $\eta_{\textit{eff1}}$. The difference between $\eta_{\textit{eff1}}$ and $\eta_{\textit{eff0}}$ is the effective index difference, also referred to as $\Delta\eta_{\textit{eff}}$, caused by the projections and recesses that form the grating. The magnitude of $\Delta\eta_{\textit{eff}}$ determines the strength of the grating reflection at $\lambda_0$. In this manner, a laser device that exhibits DFB laser optical properties, including high spectral purity is provided. Further, the periodic grating profile can be used to provide distributed feedback for other devices, such as distributed Bragg reflector (DBR) lasers and sampled grating lasers.

Figure 7A:
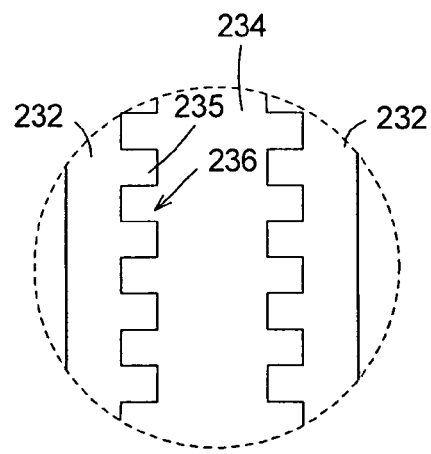
FIG. 7A is an enlarged view of part of FIG. 6 showing the periodic grating profile of the mask.

FIG. 7A is an enlarged view of a portion of the mask stripes and growth window of FIG. 6. The periodic profile of the mask stripes 232 includes a plurality of projections 235 and recesses 236. In one embodiment, the projections 235 and recesses 236 are approximately 0.1 μm square, but can have other dimensions, as long as the periodicity of the projections 235 and recesses 236 along the longitudinal direction is equal to multiples of a half wavelength of light at the desired wavelength divided by the effective refractive index of the fundamental optical mode. In one embodiment, the effective index difference ($\Delta\eta_{\textit{eff}}$) produced by the grating projection 235 and the recesses 236 causes the mask stripes 232 to impart an effective refractive index variation of about 0.001 to about 0.020 to light traveling in the optical waveguide core mesa 240.

Figure 7B:
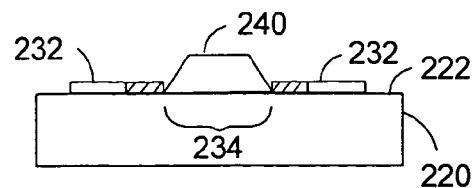
FIG. 7B is a profile view of FIG. 7A showing a buried heterostructure optical waveguide and mask.

FIG. 7B is a side view of the mask stripes shown in FIG. 7A and including the optical waveguide core mesa 240. The portion of the mask stripes 232 that are formed as described above with projections 235 and recesses 236 is shown in FIG. 7B with cross-hatching. The optical waveguide core mesa 240 is grown on the surface 222 in the growth window 234 between the mask stripes 232 as described above.

The mask stripes 232 can be formed in a number of different thicknesses ranging from approximately 0.1 μm to 0.5 μm. However, other thicknesses are possible. In two different embodiments, the mask stripes 232 are formed with thicknesses of 0.1 μm and 0.5 μm. The optical waveguide core mesa 240 has a width of approximately 1.5 μm and a height of approximately 0.2 μm. The refractive index, n, of the waveguide core mesa 240 is 3.4 and the refractive index of the surrounding InP (not shown) that is subsequently grown over the waveguide core mesa 240 and the mask stripes 232 is 3.2. Further, when the waveguide core mesa 240 is grown in the growth window 234, it may or may not follow the periodic profile of the mask stripes 232. If the waveguide core mesa 240 does not follow the contour of the mask stripes 232, then the effective index difference $\Delta\eta_{\textit{eff}}$ produced by the periodic grating structure of the mask stripes 232 is approximately 0.0022 for a 0.1 μm thick mask stripe 234 and approximately 0.0049 for a 0.5 μm thick mask stripe 234. If the growth of the optical waveguide core mesa 240 does follow the contour of the mask stripes 232, then the effective index difference $\Delta\eta_{\textit{eff}}$ produced by the periodic grating structure of the mask stripes 232 is approximately 0.0062 for a 0.1 μm thick mask stripe 232 and approximately 0.0082 for a 0.5 μm thick mask stripe 232. These values indicate that the projections 235 and recesses 236 are sufficient for producing a distributed Bragg reflector.

Figure 8A:
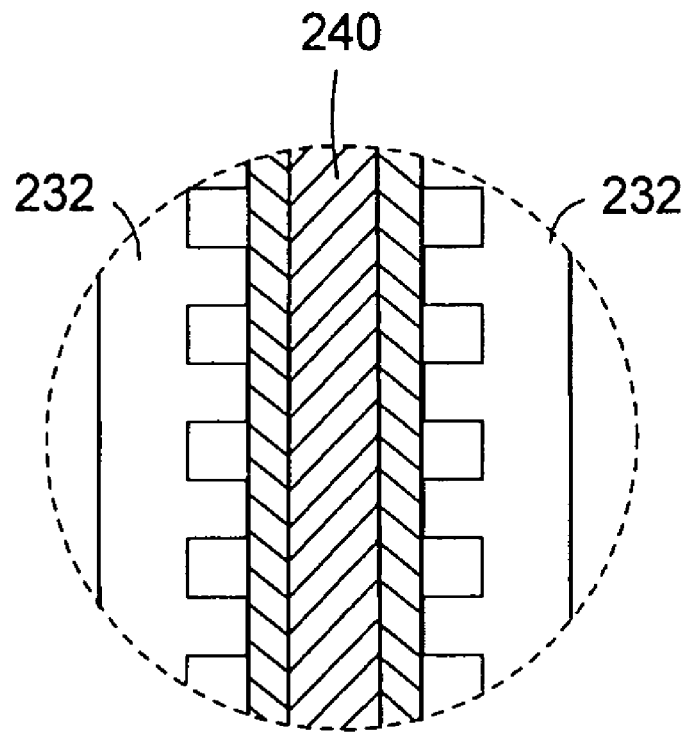
FIGS. 8A and 8B are plan views illustrating two embodiments of a waveguide core mesa grown using the mask of FIG. 6.
Figure 8B:
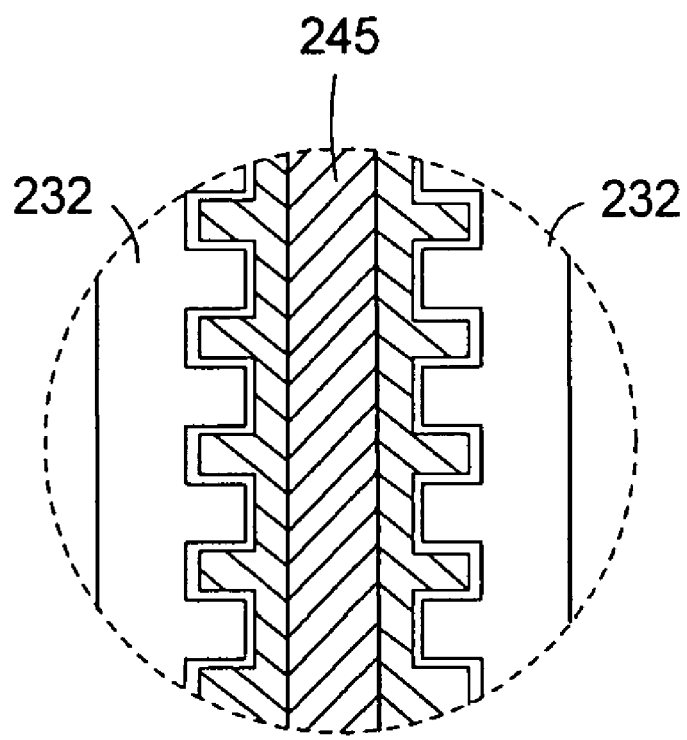

FIGS. 8A and 8B are plan views illustrating two embodiments of a waveguide core mesa grown between the mask stripes 232 of FIG. 6. In FIG. 8A the waveguide core mesa 240 is grown between the major axes of the mask stripes 232 without following the contour of the projections 235 and the recesses 236 in the mask stripes 232. In FIG. 8B, the waveguide core mesa 245 is grown between the major axes of the mask stripes 232 and generally follows the contour of the projections 235 and the recesses 236 in the mask stripes 232.

Figure 9A:
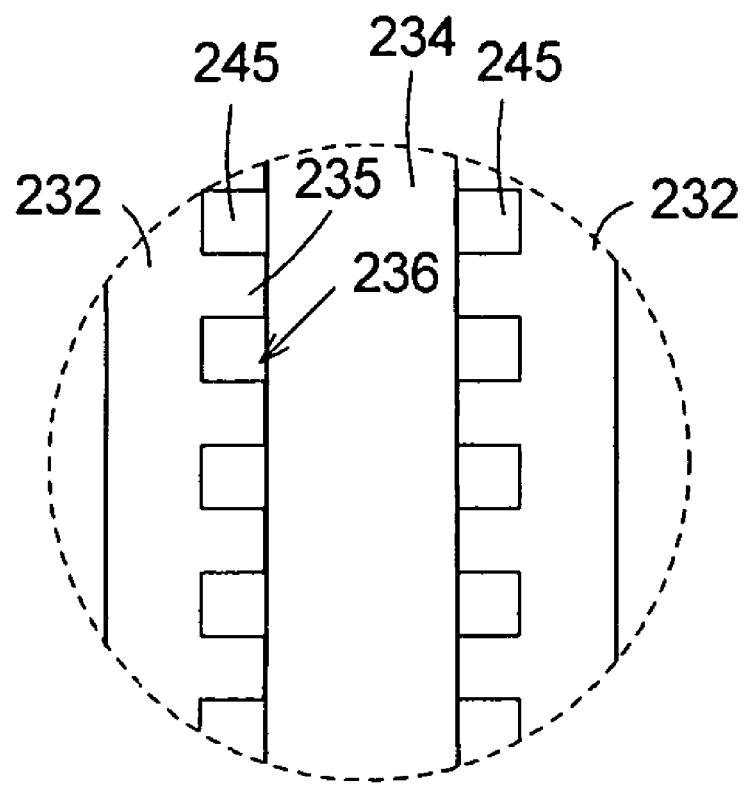
FIG. 9A is a plan view of an alternative embodiment of the mask of FIG. 7A.

FIG. 9A is a plan view of an alternative embodiment of the mask of FIG. 7A. In this embodiment, the mask stripes 232 are formed over a mask layer 245 that is formed on the growth surface 222 before the mask stripes 232 are formed. The mask layer 245 can be formed of the same material as the mask stripes 232 or can be formed from a different material from the mask stripes 232. In one embodiment, the mask layer 245 can be formed from silicon nitride ($Si_3N_4$) and the mask stripes 232 can be formed from silicon dioxide ($SiO_2$) so that etch selectivity between the mask layer 245 and the mask stripes 232 can be achieved. In this manner, the projections 235 and the recesses 236 can be formed in the mask stripe 232, while the mask layer 245 remains intact. Alternatively, if the mask layer 245 and mask stripes 232 are formed from the same material, then other selective patterning techniques, to partially etch the material of the mask stripes 232, can be used to create the structure shown in FIG. 9A.

Figure 9B:
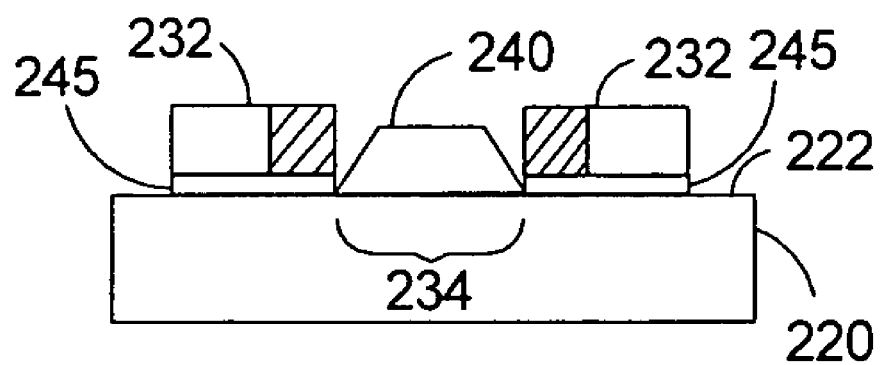
FIG. 9B is a side view of the mask stripes shown in FIG. 7A and including the optical waveguide core mesa.

FIG. 9B is a side view of the mask stripes shown in FIG. 7A and including the optical waveguide core mesa 240. In this embodiment, the portion of the mask stripes 232 that are formed as described above with projections 235 and recesses 236 is shown with cross-hatching. The mask stripes 232 are formed over the mask layer 245. The optical waveguide core mesa 240 is grown on the surface 222 in the growth window 234 between the mask stripes 232 as described above. In accordance with the selective-area growth described above, a layer of InP grown over the waveguide core mesa 240 will grow over and fill in the recesses 236 in the mask stripes 232.

Figure 10:
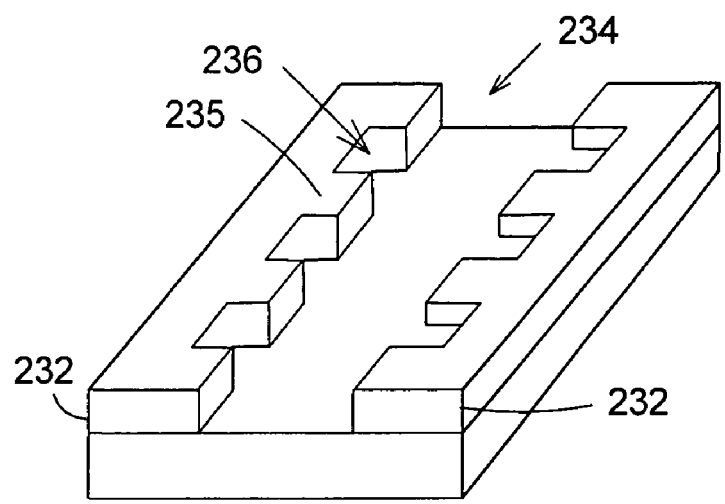
FIG. 10 is an isometric view illustrating the mask of FIGS. 7A and 7B.

FIG. 10 is an isometric view illustrating the mask stripes of FIGS. 7A and 7B. The mask stripes 232 are formed to create an effective refractive index variation in the optical waveguide core mesa 240, as described above.

Figure 11:
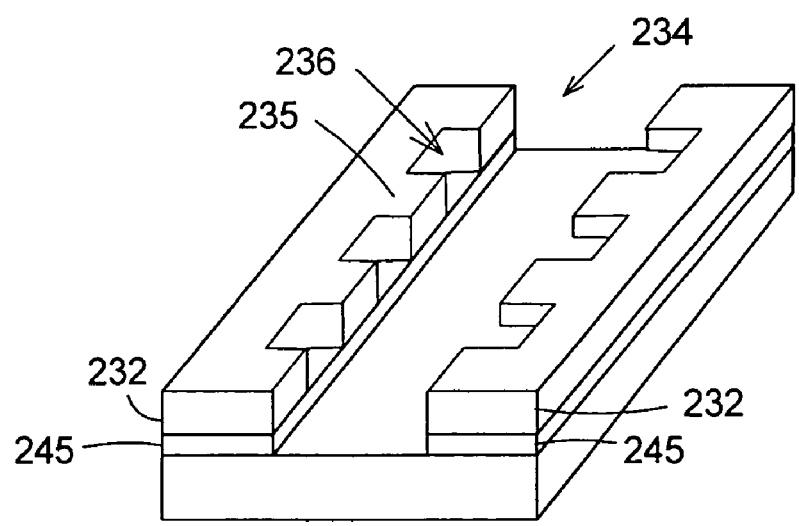
FIG. 11 is an isometric view illustrating the mask of FIGS. 9A and 9B.

FIG. 11 is an isometric view illustrating the mask of FIGS. 9A and 9B. The mask stripes 232 having the projections 235 and recesses 236 are formed over the mask layers 245 to create an effective refractive index variation in the optical waveguide core mesa 240, as described above.

This disclosure describes the invention in detail using illustrative embodiments. However, the invention defined by the appended claims is not limited to the precise embodiments described.

We claim:

1. A device, comprising:
   a growth surface;
   a growth mask on the growth surface, the growth mask defining an elongate growth window having a periodic grating profile;
   an optical waveguide core mesa located in the growth window and having a trapezoidal cross-sectional shape;
   a first cladding layer covering the optical waveguide core mesa and extending over at least part of the growth mask; and
   a second cladding layer, wherein the growth surface is a surface of the second cladding layer.

2. The device of claim 1, in which:
   the growth surface has a [100] crystalline orientation; and
   the optical waveguide core mesa comprises sidewalls having a [111] crystalline orientation.

3. The device of claim 2, in which the growth mask comprises opposed edges aligned parallel to the [011] crystalline direction of the growth surface.

4. The device of claim 1, in which the optical waveguide core mesa is homogeneous in structure and has a greater refractive index than the cladding layer.

5. The device of claim 1, in which:
   the device is a distributed feedback (DFB) laser; and
   the optical waveguide core mesa comprises a quantum well structure.

6. The device of claim 5, in which the quantum well structure comprises quantum well layers comprising aluminum, gallium, indium and arsenic.

7. The device of claim 5, in which the quantum well structure comprises quantum well layers comprising gallium, indium, arsenic and phosphorus.

8. The device of claim 5, in which the optical waveguide core mesa additionally comprises a separate confinement heterostructure in which the quantum well structure is located.

9. The device of claim 5, in which the optical waveguide core mesa comprises materials having a greater refractive index than the cladding layer and the periodic grating profile creates a refractive index difference of 0.001 to 0.020.

10. The device of claim 1, in which the growth mask and the optical waveguide core mesa are similar in thickness.

11. A distributed feedback (DFB) laser device, comprising:
    a growth surface;
    a growth mask on the growth surface, the growth mask defining an elongate growth window having a periodic grating profile;

an optical waveguide core mesa located in the growth window and having a trapezoidal cross-sectional shape; and a cladding layer covering the optical waveguide core mesa and extending over at least part of the growth mask, wherein the periodic grating profile produces a refractive index difference in the optical waveguide core mesa sufficient to provide a distributed Bragg reflection to the optical waveguide core mesa, in which the growth mask further comprises a multiple-layer structure in which one of the layers comprises the periodic grating profile.

12. The device of claim 11, in which:

the optical waveguide core mesa comprises sidewalls having a width;

a first growth temperature is at a temperature at which adatoms have a surface diffusion length greater than the width of the sidewalls; and a second growth temperature is at a temperature at which the adatoms have a surface diffusion length less than the width of the sidewalls.

13. The device of claim 12, additionally comprising growing a sublayer of the cladding material on the optical waveguide core mesa by micro-selective area growth.

14. The device of claim 13, in which growing the sublayer of the cladding material comprises setting a third growth temperature to a temperature intermediate between the first growth temperature and the second growth temperature.

* * * * *